United States Patent
Holmes et al.

(10) Patent No.: US 9,059,254 B2
(45) Date of Patent: Jun. 16, 2015

(54) OVERLAY-TOLERANT VIA MASK AND REACTIVE ION ETCH (RIE) TECHNIQUE

(75) Inventors: Steven J. Holmes, Guilderland, NY (US); David V. Horak, Essex Junction, VT (US); Charles W. Koburger, III, Delmar, NY (US); Shom Ponoth, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 259 days.

(21) Appl. No.: 13/604,660

(22) Filed: Sep. 6, 2012

(65) Prior Publication Data
US 2014/0061930 A1 Mar. 6, 2014

(51) Int. Cl.
*H01L 21/44* (2006.01)
*H01L 21/768* (2006.01)
*H01L 21/311* (2006.01)

(52) U.S. Cl.
CPC ... *H01L 21/76831* (2013.01); *H01L 2924/0002* (2013.01); *H01L 21/76807* (2013.01); *H01L 21/76816* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 6,127,263 A | 10/2000 | Parikh | |
| 6,316,348 B1 | 11/2001 | Fu et al. | |
| 6,391,771 B1 | 5/2002 | Naik et al. | |
| 6,594,540 B1 | 7/2003 | Parikh | |
| 6,620,526 B1 | 9/2003 | Tseng | |
| 6,911,389 B2 | 6/2005 | Brennan et al. | |
| 7,052,972 B2 | 5/2006 | Sandhu et al. | |
| 7,071,097 B2 | 7/2006 | Colburn | |
| 7,439,628 B2 | 10/2008 | Colburn | |
| 7,592,231 B2 | 9/2009 | Cheng et al. | |
| 7,842,601 B2 | 11/2010 | Lee et al. | |
| 8,048,813 B2 | 11/2011 | Lai et al. | |
| 2010/0072541 A1* | 3/2010 | Chung et al. | 257/330 |
| 2010/0283094 A1* | 11/2010 | Kim et al. | 257/306 |

* cited by examiner

*Primary Examiner* — Calvin Choi
(74) *Attorney, Agent, or Firm* — Scully, Scott, Murphy & Presser, P.C.; Catherine Ivers (57) ABSTRACT

A method is provided that includes first etching a substrate according to a first mask. The first etching forms a first etch feature in the substrate to a first depth. The first etching also forms a sliver opening in the substrate. The sliver opening may then be filled with a fill material. A second mask may be formed by removing a portion of the first mask. The substrate exposed by the second mask may be etched with a second etch, in which the second etching is selective to the fill material. The second etching extends the first etch feature to a second depth that is greater than the first depth, and the second etch forms a second etch feature. The first etch feature and the second etch feature may then be filled with a conductive metal.

11 Claims, 9 Drawing Sheets

OVERLAY-TOLERANT VIA MASK AND REACTIVE ION ETCH (RIE) TECHNIQUE

BACKGROUND

The present disclosure relates generally to semiconductor integrated circuits (ICs). More particularly, the present disclosure relates to methods and structures including lines and vias as used in integrated circuits (ICs).

In order to be able to make integrated circuits (ICs), such as memory, logic, and other devices, of higher integration density than currently feasible, one has to find ways to further downscale the dimensions of field effect transistors (FETs), such as MOSFETs, and complementary metal oxide semiconductors (CMOS), and of similarly-scaled conductive wiring between them. Scaling achieves compactness and improves operating performance in devices by shrinking the overall dimensions and operating voltages of the device while maintaining the device's electrical properties.

Increased scaling can provide some difficulties with forming small-pitch metal wiring and the necessary interlevel vias. Typically, self aligned processes are employed for forming the wiring and vias to the device, in which metal troughs for the lines are defined in an interlevel dielectric mask or in a hard mask, and the vias are printed and etched in such a way that only the union of the metal trough and the via shape form vias down to the underlying metal layer. Reliable printing of vias can be problematic for aggressively scaled devices, so vias having a bar shape may be employed to increase pattern printability. Typically, a via opening is formed where the via bar shape crosses the union with the metal trough for the metal line. However, if the bar overlaps onto an adjacent metal trough than the union can result in an undesirable via that could short the lines formed in the metal trough that are interconnected by the undesirable via.

SUMMARY

In one embodiment, a method is provided that includes first etching a substrate according to a first mask. The first etching forms a first etch feature in the substrate to a first depth. The first etching also forms a sliver opening in the substrate. The sliver opening may then be filled with a fill material. A second mask may be formed by removing a portion of the first mask. The substrate exposed by the second mask may be etched with a second etch, in which the second etching is selective to the fill material. The second etching extends the first etch feature to a second depth that is greater than the first depth, and the second etch forms a second etch feature. The first etch feature and the second etch feature may then be filled with a conductive metal.

In another embodiment, a method is provided that includes forming a first mask layer on a substrate that is patterned to correspond to lines, and forming a second mask layer on the substrate over the first mask layer. The combination of the first mask layer and the second mask layer provides a pattern that corresponds to vias. A shared opening region is also present between openings in the first mask layer and the second mask layer. The shared opening region may be filled with a conformal fill layer. The substrate may be first etched using the first mask layer and the second mask layer, in which the first etch forms a first opening to a first depth into the substrate. The second mask layer may be removed. The substrate may then be etched with a second etch using the first mask layer. The second etch may be selective to the first mask layer, wherein the first opening is extended to a second depth to provide openings for the vias. Openings for the lines are provided by at least one second opening that is also etched into the substrate by the second etching. At least one of the openings for the vias and the openings for the lines is then filled with a conductive material.

In another aspect, a structure is provided that includes an array of conductive pathways. The structure may include a substrate that is composed of a dielectric material. An array of lines having a length that extends along a horizontal direction of the substrate is present. At least one of the lines has a dimple region or a pinch region on its sidewall at a lower surface of the line. An array of vias having a vertical dimension that is perpendicular to the length of each of the lines in the array of conductive lines is also present. At least one of the vias in the array intersects with at least one of the lines.

In another embodiment, a structure including an array of conductive pathways is provided that includes a substrate comprised of a dielectric material, and an array of lines having a length that extends along a horizontal direction of the substrate. A sliver material may extend along a sidewall of at least one line of the array of conductive lines. An array of vias may also be present, in which each via of the an array of vias has a vertical dimension that is perpendicular to the length of the lines, wherein at least one via in the array of vias is in contact with at least one line of the array of lines.

DESCRIPTION OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "vertical", "horizontal", "top", "bottom", "width", "length", "thickness" and derivatives thereof shall relate to the disclosed structures and methods, as oriented in the drawing figures.

In some embodiments, the methods and structures disclosed herein overcome misalignment between masks for forming conductive features in an integrated circuit. In some embodiments, the conductive features include lines and vias. The lines are the conductive pathways that extend across, i.e., have a longest dimension across, the horizontal plane of the substrate. The horizontal plane is parallel to the plane defined by the upper surface of the substrate. The vias are the conductive pathways that extend along, e.g., have a longest dimension along, the vertical plane of the substrate. The vertical plane of the substrate is perpendicular to the horizontal plane of the substrate, wherein the vertical plane extends along the depth dimension of the substrate. In some embodiments, the conductive features may be more than one set of lines, wherein each set of lines has a length that spans across a different direction.

In some embodiments, the disclosed methods and structures fill the unintended etch features, i.e., sliver openings, that are created by etching the substrate with etch masks including vias openings that overlap with line openings. The misalignment between the masks may be the result of inherent variations of the photolithography process that forms the masks. For example, the mask misalignment may include at least one of the following phenomena: mask writing errors, magnification errors, tool misregistration, thermal expansion, or a combination thereof. The unintended etch feature when filled during the metal deposition steps for forming the lines and vias can become an undesired via, which in some instances can result in shorting adjacent lines or lines between levels. In some embodiments, to overcome the formation of the undesired vias, the unintended etch features, i.e., sliver openings, are filled with a selective etch material (also referred to as a fill material). After the unintended etch features, i.e., sliver openings, are filled, the etch process for forming the vias and lines may be continued with an etch process that is selective to the selective etch material that is present in the sliver openings. In some embodiments, because the sliver openings are filled with the selective etch material, subsequent etch process can not extend the depth of the sliver openings to a greater depth within the substrate. In other embodiments, the portions of the line openings and via openings that overlap, i.e., shared openings, in the mask may be filled with a selective etch material before etching the underlying substrate. FIGS. 1-10D depict some embodiments of a method for reducing the effects of misalignment between mask openings for forming lines and vias.

Figure 1:
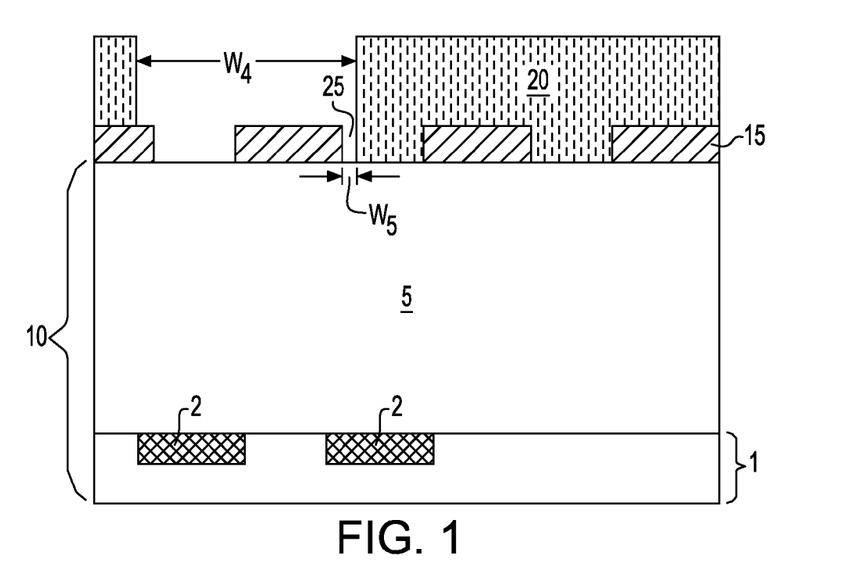
FIG. 1 is a side cross-sectional view of forming a first mask layer on a substrate that is patterned to correspond to lines on the substrate, and forming a second mask layer that is patterned to correspond to vias on the substrate, in accordance with one embodiment of the present disclosure.

FIG. 1 depicts one embodiment of forming a first mask layer 15 of a mask for forming lines and vias in a substrate 10. In one embodiment, the first mask layer 15 is patterned the to correspond to lines that are to be etched into the substrate 10. The substrate 10 may be composed of a dielectric or semiconductor material. In the embodiment that is depicted in FIG. 1, the substrate 10 may include an interlevel dielectric layer 5 and a base semiconductor substrate 1. The interlevel dielectric layer 5 may include any dielectric material. For example, the interlevel dielectric layer 5 may be selected from the group consisting of silicon-containing materials, such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SILK™, other carbon-containing materials, organo-inorganic materials such as spin-on glasses and silsesquioxane-based materials, and diamond-like carbon (DLC, also known as amorphous hydrogenated carbon, α-C:H). Additional choices for the interlevel dielectric layer 5 include any of the aforementioned materials in porous form, or in a form that changes during processing to or from being porous and/or permeable to being non-porous and/or non-permeable.

The interlevel dielectric 5 that is depicted in FIG. 1 may be present on a base semiconductor substrate 1. The base semiconductor substrate 1 may be any silicon-containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. The base semiconductor substrate 1 may also be composed of compound semiconductor materials, such as a type III-V semiconductor. The base semiconductor substrate 1 may include conductive lines, semiconductor devices or memory devices formed within the base semiconductor substrate 1 and/or on the base semiconductor substrate 1. Although FIG. 1 depicts a conductive line 2 that can be formed in the base semiconductor substrate 1, the present disclosure is not limited to only this example. Examples of semiconductor devices that may be present on the base semiconductor substrate 1 include complementary metal oxide semiconductor (CMOS) devices, fin field effect transistors (finFETs), junction field effect transistors (JFETs), bipolar junction transistor (BJTs) or a combination thereof. Examples of memory devices that may be present on or formed within the base semiconductor substrate 1 include embedded dynamic random access memory or flash memory. The base semiconductor substrate 1 may include any electrical device that can be electrically contacted by a via that can be extending through the interlevel dielectric layer 5. The substrate 10 that is depicted in FIG. 1 is only one example of a substrate 10 that may be suitable for use with the methods and structures disclosed herein.

The first mask layer 15 may be patterned to correspond to lines that are to be etched into the substrate 10. The first mask layer 15 may be a hard mask. The hard mask may be composed of metallic material such as TiN. In other embodiments, first mask layer 15 may be composed of dielectric material including, but not limited to, oxides, nitrides or oxynitride dielectrics, in which the dielectric material is a different dielectric material than the interlevel dielectric layer 5. Hard mask materials may also include dielectric systems that may be deposited by chemical vapor deposition (CVD) and related methods. Spin-on dielectrics may also be utilized as a hard mask material including, but not limited to: silsequioxanes, siloxanes, and boron phosphate silicate glass (BPSG). In the embodiments, in which the hardmask material is a dielectric, the hard mask material that is deposited on the substrate 10 may be referred to as a first dielectric layer.

The first mask layer 15 of the hard mask material may be formed by blanket depositing a layer of hard mask material followed by patterning using photolithography and etch processes. In one embodiment, the hard mask material may be deposited using chemical vapor deposition (CVD). Examples of chemical vapor deposition methods that are suitable for forming the hard mask material include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The hard mask material may also be deposited using evaporation, chemical solution deposition, spin on deposition, and physical vapor deposition (PVD) methods. The hard mask material may have a thickness ranging from 5 nm to 90 nm. In another embodiment, the hard mask material may have a thickness ranging from 10 nm to 30 nm.

Following deposition, the blanket layer of hard mask material may be patterned using photolithography and etch processes, in which the openings formed in the layer of the hard mask material are selected to correspond with the subsequently formed lines in the substrate 10. In one embodiment, a layer of photoresist material is applied atop the layer of hard mask material via spin coating or similar processes. The photoresist material may be comprised of a dielectric material including carbon, oxygen, and various inorganic materials. Following application of the photoresist layer, the photoresist is soft-baked, where the solvents of the photoresist layer are evaporated via heating. The layer of photoresist is then patterned using a photolithography process. For example, a pattern is formed using a reticle or photomask and transferred into the layer of photoresist on the surface to be etched. Light is passed through the opaque pattern of the reticle, which in turn produces a patterned image on the layer of photoresist. The photoresist layer is a light or radiation sensitive material and exposure to light causes changes in the photoresist structure. For example, exposure to light may change the exposed portions of the photoresist from a soluble condition to an insoluble one.

Following exposure, the pattern is developed utilizing a resist developer, such as a chemical solvent. The developer leaves a hole in the resist layer that corresponds to the opaque pattern of the reticle. An alternative resist strategy, commonly referred to as a negative resist, leaves a pattern in the resist opposite to that on the mask. Development of the pattern is conducted using development techniques including, but not limited to: continuous spray development and puddle development. Following development of the patterned photoresist layer a photoresist mask is formed.

Following formation of the photoresist mask over the layer of hard mask material, an etch process is employed to etch the hard mask material selectively to the photoresist mask and the underlying substrate 10, i.e., interlevel dielectric layer 5. As used herein, the term "selective" in reference to a material removal process denotes that the rate of material removal for a first material is greater than the rate of removal for at least another material of the structure to which the material removal process is being applied. For example, a selective etch may remove one material to a second material at a rate that is greater than 10:1. In another example, a selective etch may remove one material to a second material at a rate that is greater than 100:1

In one embodiment, the etch process that etches the hard mask material to provide the first mask layer 15 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

In one embodiment, the openings that are forming in the first mask layer 15 may have a width W1, W2, W3 ranging from 14 nm to 80 nm. In another embodiment, the openings that are formed in the first mask layer 15 may have a width W1, W2, W3 ranging from 10 nm to 80 nm. The pitch separating adjacent openings in the first mask layer 15 may range from 14 nm to 80 nm. In another embodiment, the pitch separating adjacent openings in the first mask layer 15 may range from 10 nm to 80 nm.

FIG. 1 further depicts one embodiment of forming a second mask layer 20 on the substrate 10. In some embodiments, the combination of the first mask layer 15 and the second mask layer 20 functions as a first etch mask for a first etch process of the substrate 10. After the first etch process, the second mask layer 20 can be removed and the remaining first mask layer 15 can function as a second etch mask for etching the substrate 10 with a second etch process.

In one embodiment, the second mask layer 20 is patterned to correspond to vias that are to be etched into the substrate 10, e.g., interlevel dielectric layer 5. The second etch mask 20 may be composed of a photoresist. The photoresist mask that provides the second etch mask 20 is similar to the photoresist mask that is used to form the first etch mask 15, as described above. For example, the photoresist mask that provides the second etch mask 20 may be formed by applying a photoresist to the surface to be etched, exposing the photoresist to a pattern of radiation, and then developing the pattern into the photoresist utilizing resist developer. Once the patterning of the photoresist is completed, the sections covered by the photoresist are protected while the exposed regions are removed using a selective etching process that removes the unprotected regions. In other embodiments, the second mask 20 is composed of a hard mask material that is similar to the first etch mask 15, but is typically composed of a material having a different etch selectivity as the first etch mask 15.

In one embodiment, the openings that are forming in the second mask layer 20 may have a width W4 ranging from 14 nm to 80 nm. In another embodiment, the openings that are forming in the second mask layer 20 may have a width W4 ranging from 20 nm to 28 nm. The vias that are formed using the mask arrangements disclosed herein may have a rectangular or square cross section when view from a top down perspective. The length dimension of the vias formed by the mask arrangements disclosed herein may range from 1.0 to 2.0 times the width dimension (10 nm to 150 nm), and the width dimension of the vias may range from 10 nm to 80 nm. In another embodiment, length dimension of the vias may range from 14 nm to 56 nm, and the width dimension of the vias may range from 14 nm to 112 nm. In another embodiment, the openings that are formed in the second mask layer 20 may be circular.

In one embodiment, the combination of the first mask layer 15 and the second mask layer 20 are configured to provide a first opening in the substrate 10, e.g., interlevel dielectric 5, that when extended through the interlevel dielectric 5 provides a via. The first opening is formed in the exposed portion of the substrate 10, which is the intended pattern that is provided by the first and second mask layers 15, 20. The first mask layer 15 and the second mask layer 20 may be misaligned to form a shared opening region 25. The shared opening region 25 exposes a portion of the substrate 10 that is not intended to be etched by the etch process that forms at least one of a line or an array. The source of misalignment between the first mask layer 15 and the second mask layer 20 may include at least one of the following phenomena: mask writing errors, magnification errors, tool misregistration, thermal expansion, or a combination thereof. In one embodiment, the shared opening region 25 has a width W5 less than 25 nm. In another embodiment, the shared opening region 25 has a width W5 less than 8 nm.

Figure 2:
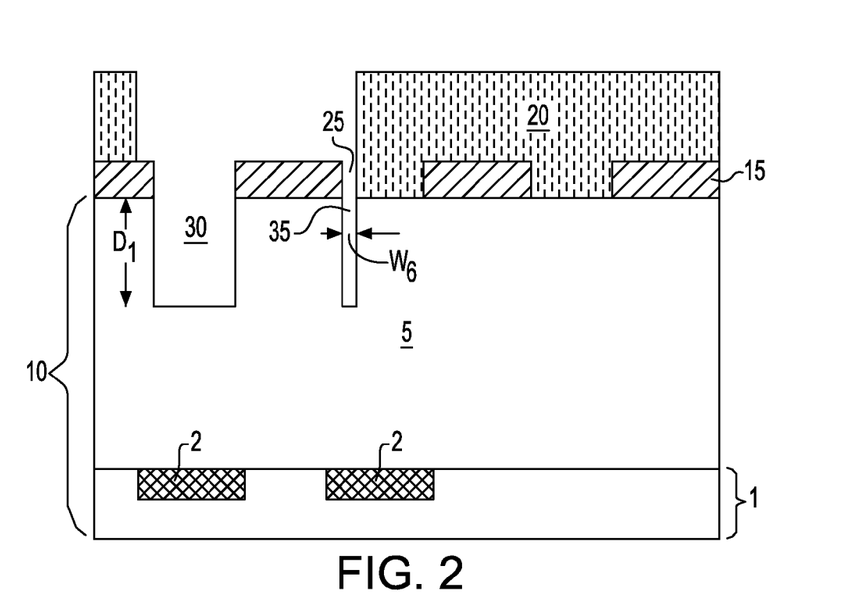
FIG. 2 is a side cross-sectional view depicting one embodiment of first etching the substrate using the first mask layer and the second mask layer as a first etch mask, wherein the etching forms a first opening to a first depth into the substrate and a shared opening region between the first mask layer and the second mask layer forms a sliver opening in the substrate, in accordance with the present disclosure.

FIG. 2 depicts one embodiment of first etching the substrate 10, e.g., interlevel dielectric 5, using the first mask layer 15 and the second mask layer 20 as a first etch mask. In some embodiments, the first etching forms a first opening 30 to a first depth D1 into the substrate 10, and the shared opening region 25 between the first mask layer 15 and the second mask layer 20 forms a sliver opening 35 in the substrate 10, e.g., interlevel dielectric layer 5. The first etching that forms the first opening 30 and the sliver opening 35 may be provided by an anisotropic etch process. The anisotropic etch may include reactive-ion etching (RIE). In some embodiments, reactive ion etch (RIE) is a form of plasma etching, in which the surface to be etched may be placed on an RF powered electrode and takes on a potential that accelerates an etching species, which is extracted from a plasma, towards the surface to be etched, wherein a chemical etching reaction takes place in the direction normal to the surface being etched. Other examples of anisotropic etching that can be used at this point of the present disclosure include ion beam etching, plasma etching or laser ablation. The first etching may be provided by a selective etch. For example, in one embodiment, the etch process employed to form the first opening 30, which also can form the sliver opening 35, may remove the material of the substrate 10, e.g., interlevel dielectric layer 5, selectively to the first mask layer 15 and the second mask layer 20.

The first etching process may be a timed etch. The first etch may be continued until the base of the first opening 30 that is extended into the interlevel dielectric layer 5 reaches a depth ranging from 25 nm to 400 nm, as measured from the upper surface of the interlevel dielectric layer 5. In another embodiment, the first etch may be continued until the base of the first opening 30 that is extended into the interlevel dielectric layer 5 reaches a depth D1 ranging from 40 nm to 200 nm, as measured from the upper surface of the interlevel dielectric layer 5. The sliver opening 35 can be formed at the same time as the first opening, and can formed by a misalignment of the first mask layer 15 and the second mask layer 20. Because the sliver opening 35 and the first opening 30 are both formed in the same interlevel dielectric, and the sliver opening 35 and the first opening 30 are both formed with the first and second mask layers 15, 20, the sliver opening 35 and the first opening 30 may both be formed to approximately the same depth within the substrate 10, i.e., interlevel dielectric layer 5.

Figure 3:
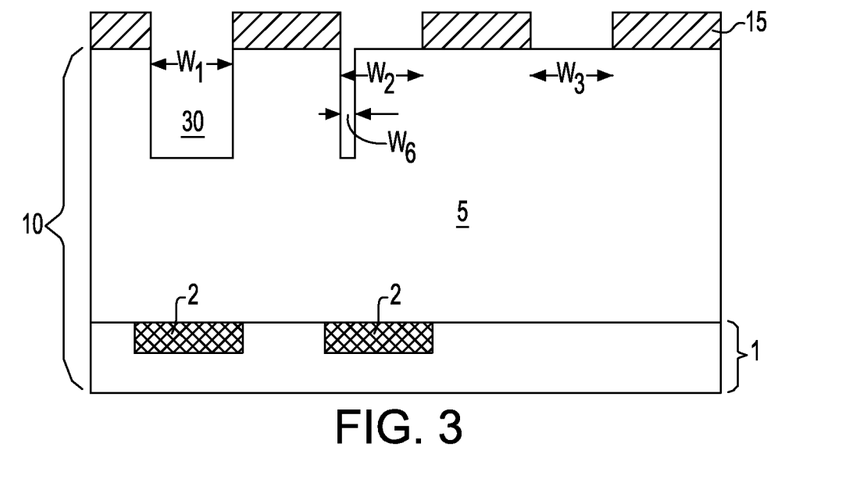
FIG. 3 is a side cross-sectional view depicting removing the second mask layer, in accordance with one embodiment of the present disclosure.

FIG. 3 depicts one embodiment of removing the second mask layer 20. In one embodiment, the second mask layer 20 may be removed using oxygen ashing, chemical stripping or selective etching. For example, in one embodiment, the second mask layer 20 may be removed by an etch that is selective to the substrate 10, e.g., interlevel dielectric layer 5, and the first mask layer 15. In some embodiments, in which the combination of first mask layer 15 and the second mask layer 20 provide a first etch mask, removing the second mask layer 20 provides a second etch mask that may be composed only of the first mask layer 15.

Figure 4:
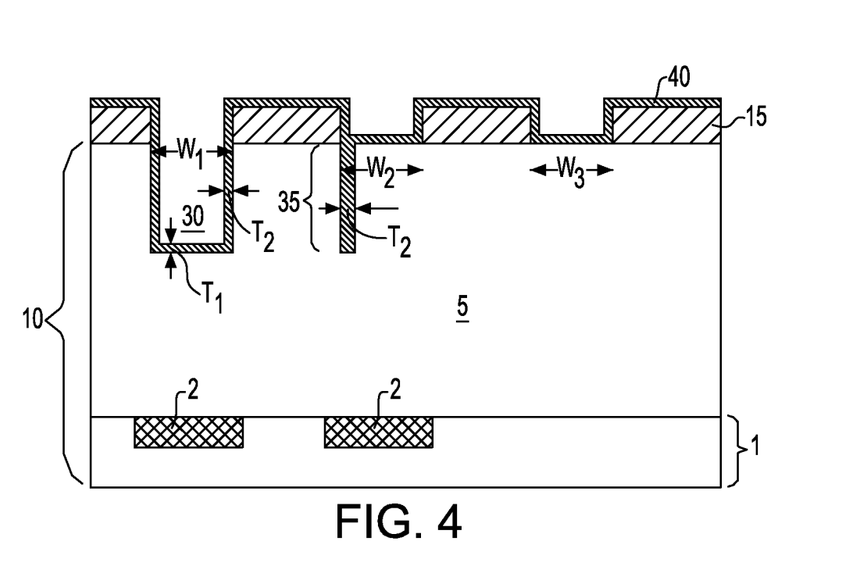
FIG. 4 is a side cross-sectional view depicting one embodiment of conformally depositing a fill material layer to fill the sliver opening, wherein a first portion of the fill material layer that is deposited on the first opening has a first thickness, and a second portion of the fill material layer that is present in the sliver opening has a second thickness that fills the sliver opening, in accordance with the present disclosure.

FIG. 4 depicts one embodiment of conformally depositing a material layer to fill the sliver opening 35 with the material for selective etching 40. The material for selective etching 40 is a material that is not etched by an etch process that removes the material of the substrate 10, e.g., interlevel dielectric layer 5. The material for selective etching 40 is interchangeably referred to as the fill material 40. In one embodiment, the selective etch material 40 may be a dielectric material, such as an oxide, nitride, or oxynitride. In some embodiments, the selective etch material 40 may be at least one of $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). In the embodiments, in which the selective etch material 40 is a dielectric material, the selective etch material 40 may be referred to as a second dielectric layer. The selective etch material 40 can alternatively be a semiconductor material. It is noted that it is not intended that the present disclosure be limited to only the above material compositions for the selective etch material 40. For example, the selective etch material 40 may be any material that the substrate 10, e.g., interlevel dielectric layer 5, can be selectively etched to. For example, materials that the substrate 10 can be etched to at a ratio of 5:1 or greater can be suitable for the selective etch material 40. In another example, materials that the substrate 10 can be etched to at a ratio of 100:1 or greater can be suitable for the selective etch material 40.

In some embodiments, the selective etch material 40 may be a conformal layer that is blanket deposited over the substrate 10 including the first mask layer 15, first opening 30, and the sliver opening 35 using a conformal deposition process. The term "conformal" denotes a layer having a thickness that does not deviate from greater than or less than 20% of an average value for the thickness of the layer. The selective etch material 40 may be deposited using chemical vapor deposition (CVD). Chemical vapor deposition (CVD) is a deposition process in which a deposited species is formed as a result of chemical reaction between gaseous reactants at an elevated temperature (typically greater than 200° C.), wherein a solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The selective etch material 40 may also be deposited using evaporation, chemical solution deposition, spin on deposition, and physical vapor deposition (PVD) methods.

The thickness of the selective etch material 40, i.e., fill material, is selected so that it fills the sliver opening 35. More specifically, in one embodiment, the selective etch material 40 is deposited so that a first portion of the material layer of the selective etch material 40 that is deposited on the first opening 30 has a first thickness T1, and a second portion of the material layer of the selective etch material 40 that is present in the sliver opening 35 has a second thickness T2 that fills the sliver opening 35. In one embodiment, the selective etch material 40 is deposited to have a thickness that is between $5/16^{th}$ the width W6 of the sliver opening 35 and $11/16^{th}$ the width W6 of the sliver opening 35. In another embodiment, the selective etch material 40 is deposited to have a thickness that is between $3/8^{th}$ the width W6 of the sliver opening 35 and $5/8^{th}$ the width W6 of the sliver opening. In one example, the selective etch material 40 is deposited to have a thickness that is between $3/8^{th}$ the width W6 of the sliver opening 35 and $5/8^{th}$ the width W6 of the sliver opening 35. Although, the selective etch material 40 is typically deposited using a conformal deposition method, the portion of the selective etch material 40 that is present in the sliver opening 35 has a greater thickness than the remaining portions of the selective etch material 40 that is not present in the sliver opening 35, because the selective etch material 40 is filling the sliver opening 35 from both sidewall surfaces.

Figure 5:
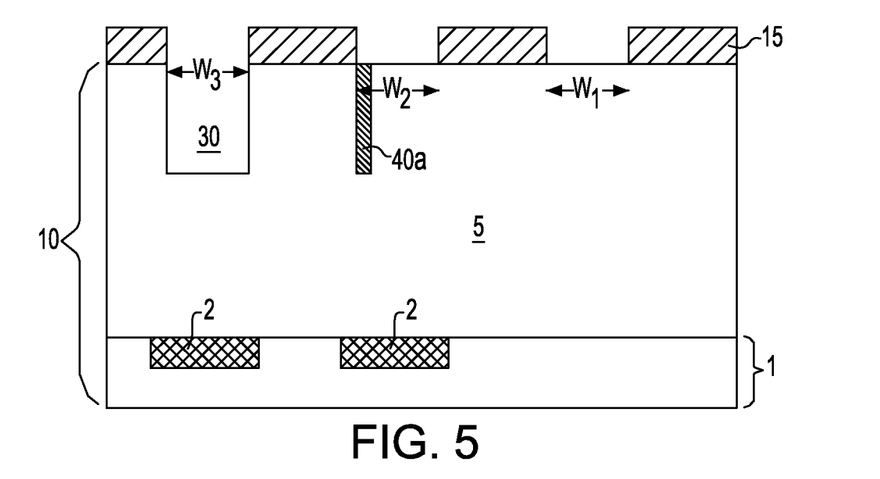
FIG. 5 is a side cross-sectional view depicting one embodiment of isotropically etching the fill material layer to remove the first portion of the fill material layer, in which the second portion of the fill material layer remains in the sliver opening, in accordance with the present disclosure.

FIG. 5 depicts one embodiment of isotropically etching the selective etch material to remove a first portion of the material layer of the selective etch material, in which a second portion of the material layer of the selective etch material 40a remains in the sliver opening 35. The first portion of the material layer of the selective etch material is the portion that is present in the first openings 30 and is present on the first mask layer 15, but is not present within the sliver opening 35. One example of an isotropic etch is a wet chemical etch. In another embodiment, the isotropic etch process may be a plasma etch, wet etch, or a combination thereof. In one embodiment, in which the selective etch material is composed of silicon nitride ($SiO_2$), the upper surface of the substrate 10, e.g., interlevel dielectric 5, is SiCOH, and the first mask layer 15 is composed of TiN, the wet etch chemistry for removing the first portion of the material layer of the selective etch material 40a may be composed of dilute HF or buffered HF. The portion of the selective etch material 40a that remains in the sliver opening 35 after the isotropic etch that removes the selective etch material from at least the first opening 30 is hereafter referred to as a sliver fill 40a.

Figure 6:
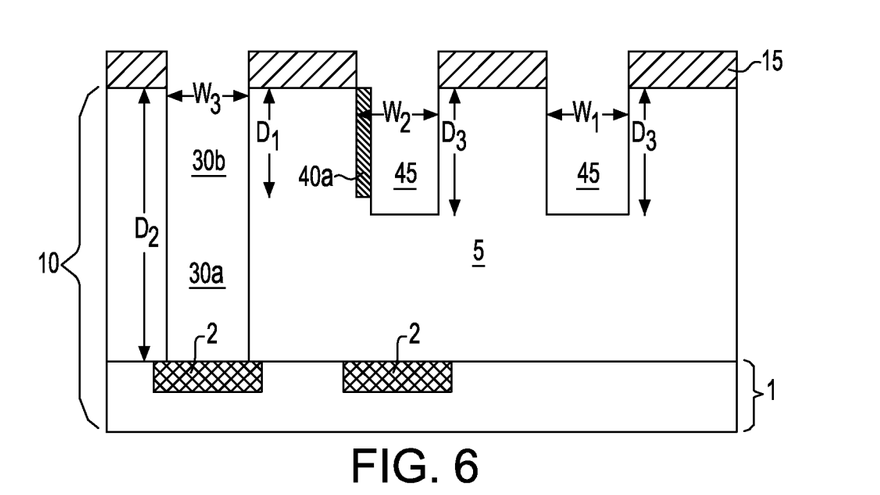
FIG. 6 is a side cross-sectional view depicting one embodiment of second etching the substrate using the first mask layer as a second etch mask with an etch that is selective to the first mask layer and the fill material that fills the sliver opening, in accordance with the present disclosure.

FIG. 6 depicts one embodiment of second etching the substrate 10, e.g., the interlevel dielectric 5, using only the first mask layer 15 as a second etch mask with an etch that is selective to the first mask layer 15 and the selective etch material that fills the sliver opening, i.e., sliver fill material 40a. In one embodiment, the second etching of the substrate 10, e.g., the interlevel dielectric layer 5, with the first mask layer 15 as a second etch mask extends the first opening 30a to a second depth D2 to provide openings 30a for the vias. In one embodiment, the second depth D2 ranges from 50 nm to 500 nm. In another embodiment, the second depth D2 ranges from 75 nm to 200 nm. In one embodiment, the first opening 30a is extended to a second depth D2 that extends through the entire thickness of the interlevel dielectric layer 5 to another line 2 that is present in the base semiconductor substrate 1 that is underlying interlevel dielectric layer 5. In another embodiment, the first opening 30a is extended through the entire thickness of the interlevel dielectric layer 5 to a semiconductor device, or memory device (not depicted), that is present in the underlying base semiconductor substrate 1. The openings 30a for the vias are hereafter referred to as via openings 30a.

The second etching of the substrate 10, e.g., the interlevel dielectric layer 5, using the first mask layer 15 as the etch mask also forms the openings for the lines 30b, 45. The openings for the lines 30b, 45 are hereafter referred to as line openings 30b, 45. In one embodiment, the line openings 30b, 45 are provided by the portion 30b of the first opening that extends to the first depth D1 and a separate second opening 45 that is etched into the substrate 10, e.g., interlevel dielectric 5, at a depth D3 that is less than the second depth D2 of the via openings 30a. In one embodiment, the line openings identified by reference numbers 30b and 45 have the same depth. In one embodiment, the depth D3 of the line openings 45 that are patterned using only the first mask layer 15 may range from 30 nm to 400 nm. In one embodiment, the depth D3 of the line openings 45 that are patterned using only the first mask layer 15 may range from 40 nm to 150 nm In one embodiment, the second etching of the substrate 10 is provided by an anisotropic etch process. Examples of anisotropic etch processes that are suitable for this stage of the present disclosure include reactive ion etch (RIE), ion beam etching, laser ablation or a combination thereof. The etch method for the second etch of the substrate 10 typically has an etch chemistry that removes the material of the substrate 10, i.e., interlevel dielectric layer 5, selectively to the first mask layer 15 and the sliver fill 40a. In some embodiments, because the sliver fill 40a is present in the sliver opening, and the second etch is selective to the sliver fill 40a, the sliver fill 40a obstructs the second etch from extending the sliver opening to a further depth within the substrate 10, e.g., interlevel dielectric layer 5. In one embodiment, in which the sliver fill 40a is composed of SiO$_2$, the substrate 10, e.g., interlevel dielectric 5, is SiCOH, and the first mask layer 15 is composed of TiN.

Figure 7:
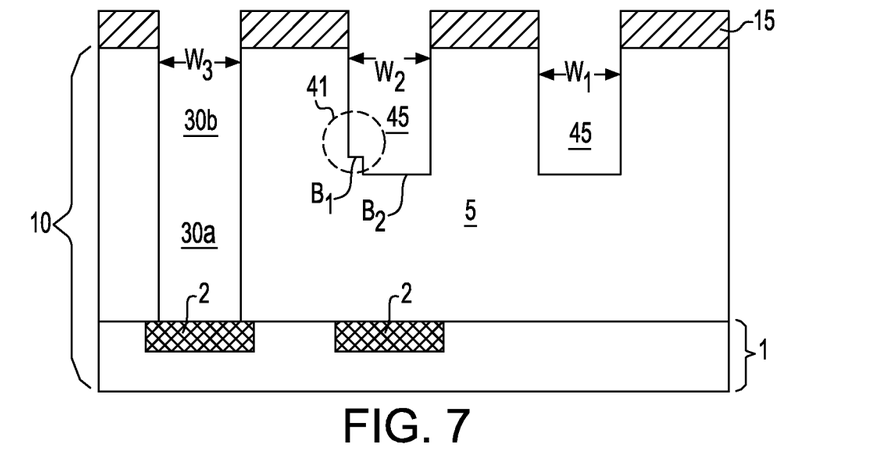
FIG. 7 is a side cross-sectional view depicting removing the fill material that fills the sliver opening, in accordance with one embodiment of the present disclosure.

FIG. 7 depicts one embodiment of removing the sliver fill 40a after the second etch of the substrate 10, e.g., interlevel dielectric layer 5. The sliver fill 40a may be removed by an etch that is selective to at least the substrate 10, e.g., interlevel dielectric layer 5, and optionally may be selective to the first mask layer 15. The etch process for removing the sliver fill 40a may be an anisotropic etch, such as reactive ion etch (RIE) or an isotropic etch, such as a wet chemical etch. In some embodiments, removing the sliver fill 40a forms a pinch region 41 on at least one sidewall of the line opening 45. The base B1 of the pinch region 41 is in direct contact with the base of the sliver fill 40a after the second etch forms the second openings 45 and before the sliver fill 40a is removed. If the first depth D1 is smaller than the depth D3 of the second opening then the pinch region 41 has a base surface B1 at a lesser depth within the substrate 10, e.g., interlevel dielectric layer 5, than the depth of the base B2 of the second opening 45 that is formed by the second etch. In one embodiment, the base surface B1 of the pinch region 41 is vertically offset from the base B2 of the second opening 45 by a dimension ranging from 0 nm to 100 nm. In another embodiment, the base surface B1 of the pinch region 41 is vertically offset from the base B2 of the second opening 45 by a dimension ranging from 5 nm to 15 nm.

Figure 8:
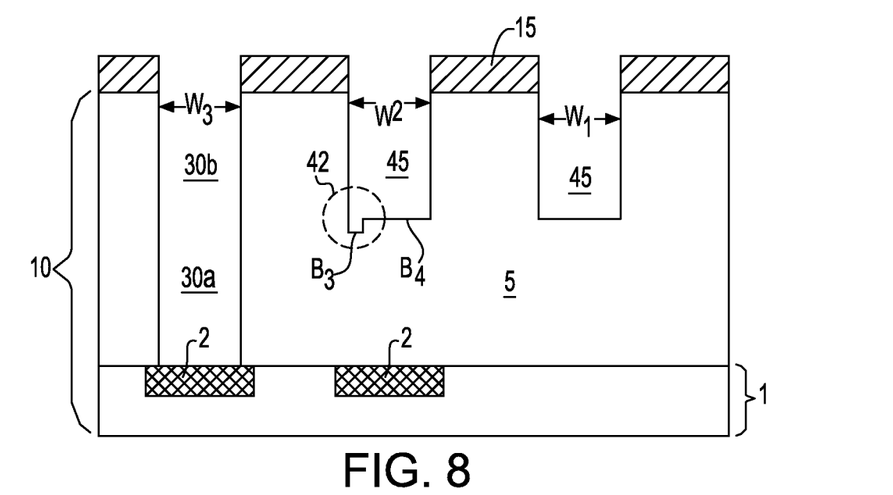
FIG. 8 is a side cross-sectional view depicting another embodiment of removing the fill material that fills the sliver opening, in accordance with the present disclosure.

FIG. 8 depicts another embodiment of removing the sliver fill 40a. In the embodiment that is depicted in FIG. 8, the second etch of the substrate 10 that is described above with reference to FIG. 6 for forming the via openings 30a and the line openings 45 in the interlevel dielectric layer 5 also removes the sliver fill 40a. In this embodiment, the etch for forming the via openings 30a and the line openings 45 is not selective to the sliver fill 40a. In this embodiment a pinch region is not formed in the sidewalls of the line openings 45, but a dimple region 42 may be formed. The dimple region 42 may be formed by an over etch of the sliver fill 40a. The dimple region 42 has a base surface B3 at a greater depth within the substrate 10, e.g., interlevel dielectric 5, than the depth of the base B4 of the second opening 45 that is formed by the second etch. In one embodiment, the base surface B3 of the dimple region 42 is vertically offset from the base B4 of the second opening 45 by a dimension ranging from 0 nm to 20 nm. In another embodiment, the base surface B3 of the dimple region 42 is vertically offset from the base B5 of the second opening 45 by a dimension ranging from 5 nm to 10 nm.

Figure 9:
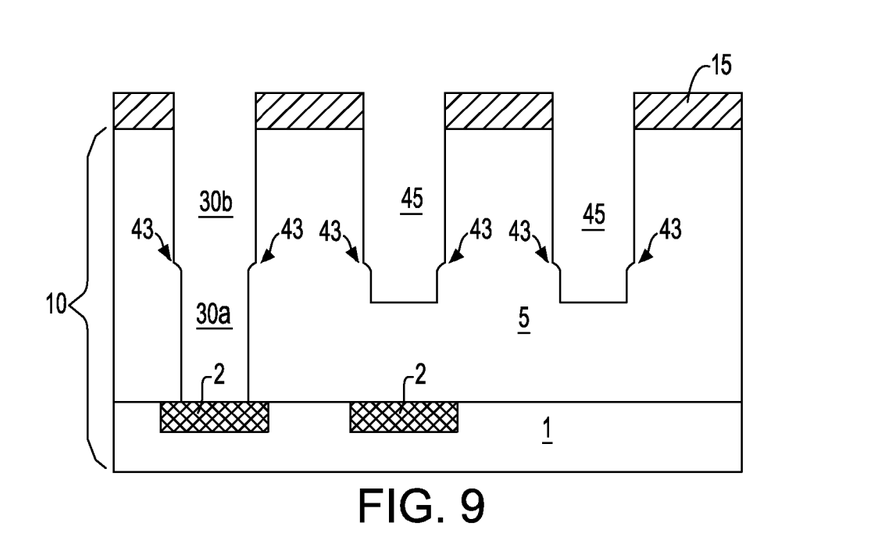
FIG. 9 is a side cross-sectional view depicting the lines and vias formed using another embodiment of the present disclosure, in which the structure is formed by conformally depositing the fill material that fills the sliver opening over the entire structure depicted in FIG. 3 followed by etching the blanket fill material using the second etch that is depicted in FIG. 6, in accordance with the present disclosure.

FIG. 9 depicts another embodiment of the present disclosure that does not employ the isotropic etch that is applied to the sliver fill 40 (described above as a selective etch material) that is described above with reference to FIGS. 4 and 5. More specifically, following the formation of the sliver fill 40 depicted in FIG. 4, the second etch is applied to the substrate 10, e.g., interlevel dielectric layer 5, that is described with reference to FIG. 6, without applying the isotropic etch that is described with reference to FIG. 5. In the embodiment that is depicted in FIG. 9, the second etch of the substrate 5, e.g., interlevel dielectric 5, also removes the sliver fill 40. In this embodiment, if the second etch of the substrate 10, e.g., interlevel dielectric layer 5, removes the sliver fill 40 at the same rate as the substrate 10 material, e.g., interlevel dielectric layer 5, the vias will shrink compared to the lines by approximately twice the width/thickness of the sliver fill. Shoulders 43 may also be present at the base of the lines.

Removing the sliver fill 40a is optional. In some embodiments, the sliver fill 40a may remain in the final integrated circuit (IC) structure. For example, the sliver fill 40a may fill the dimple, pinch region and/or extend along the sidewall of said at least one of the conductive line.

Figure 10A:
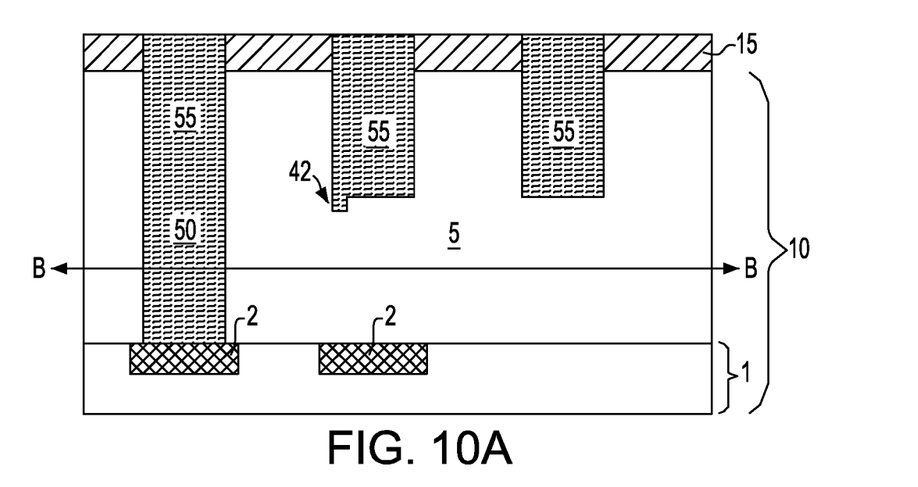
FIG. 10A is a side cross-sectional view depicting filling at least one of the openings for the vias and the openings for the lines with a conductive material, wherein the at least one of the vias contacts an underlying line, in accordance with one embodiment of the present disclosure.
Figure 10B:
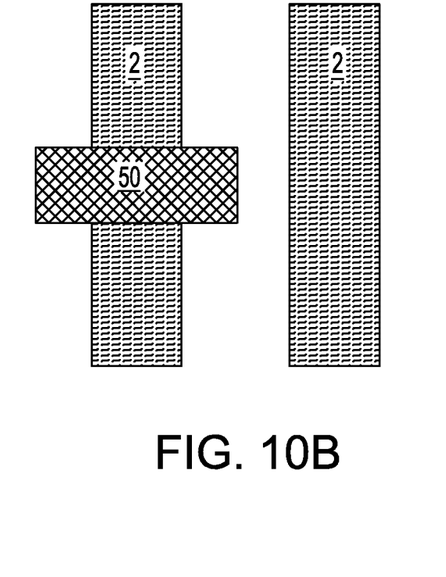
FIG. 10B is a top down planar view along section line B-B in FIG. 10A.
Figure 10C:
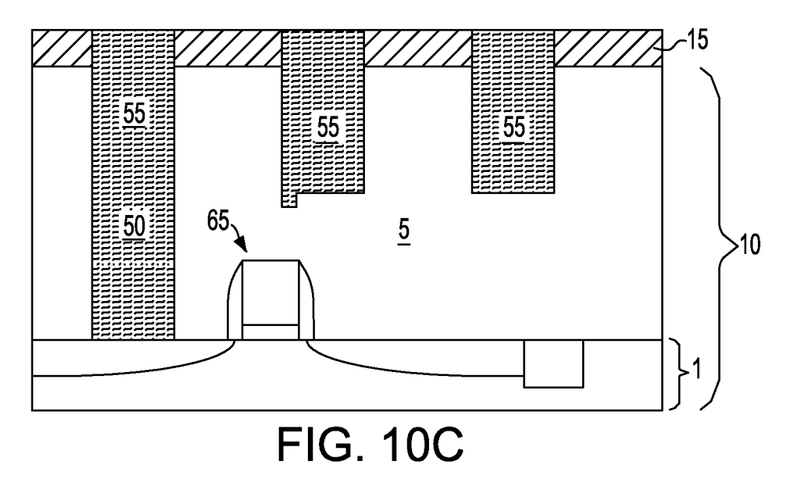
FIG. 10C is a side cross-sectional view depicting filling at least one of the openings for the vias and the openings for the lines with a conductive material, wherein the at least one of the vias contacts an underlying semiconductor device, in accordance with one embodiment of the present disclosure.

FIGS. 10A-10CD depict filling the via openings 30a and the line openings 30b, 45 with a conductive material. The term "conductive" denotes a room temperature conductivity greater than about $10^{-10}$ $(\Omega\text{-m})^{-1}$. Filling the via openings 30a and the line openings 30b, 45 with a conductive material forms vias 50 and lines 55. In one embodiment, the conductive material may be a metal. Metals that are suitable for forming the vias 50 and the lines 55 may include aluminum (Al), copper (Cu), titanium (Ti), tungsten (W), tantalum (Ta), platinum (Pt) and a combination thereof. The conductive material, e.g., metal, may be deposited in the via openings 30a and the line openings 30b, 45 using a physical vapor deposition (PVD) method, plating, and evaporation. Examples of sputtering apparatus that may be suitable for depositing the conductive material for the vias 50 and the lines 55 include DC diode type systems, radio frequency (RF) sputtering, magnetron sputtering, and ionized metal plasma (IMP) sputtering. In another embodiment, the vias 50 and the lines 55 are formed using a deposition process, such as chemical vapor deposition (CVD). Variations of chemical vapor deposition (CVD) processes for depositing the vias 50 and the lines 55 include, but are not limited to, Atmospheric Pressure CVD (APCVD), Low Pressure CVD (LPCVD) and Plasma Enhanced CVD (PECVD), Metal-Organic CVD (MOCVD) and others.

Figure 10D:
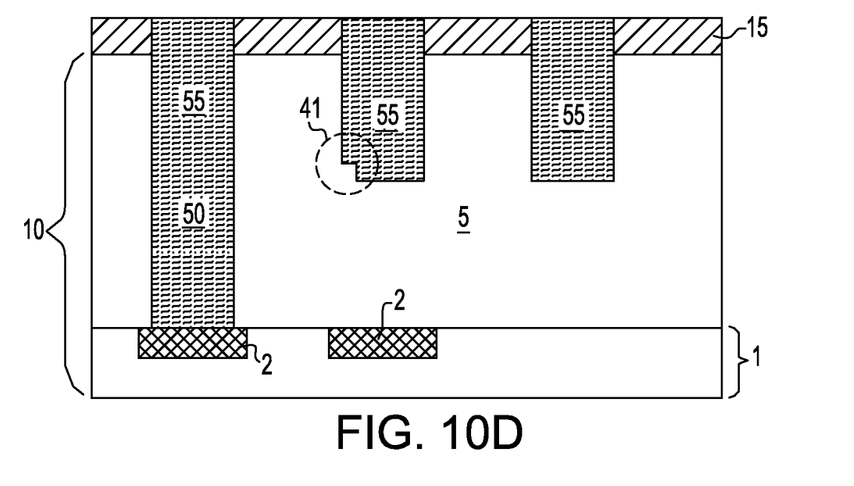
FIG. 10D is a side cross-sectional view depicting a pinch region present at a intersection between the base and sidewall of a line, in accordance with one embodiment of the present disclosure.
Figure 10E:
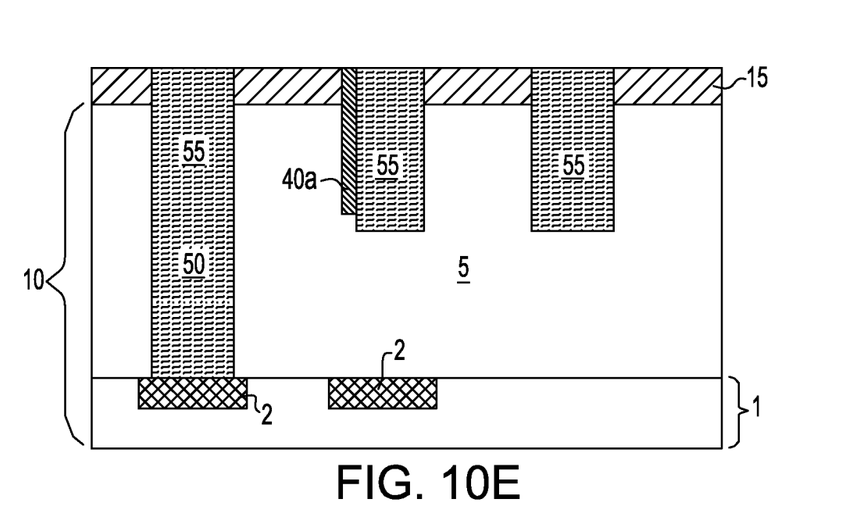
FIG. 10E is a side cross-sectional view depicting a sliver dielectric present along a sidewall of a line, in accordance with one embodiment of the present disclosure.

FIG. 10A depicts one embodiment of the present disclosure in which at least one of the vias 55 contacts an underlying line 2 that is present in the base semiconductor substrate 1. FIG. 10C depicts one embodiment the present disclosure in which at least one of the vias 55 contacts an underlying semiconductor device 65 that is present in the base semiconductor substrate 1. Examples of semiconductor devices 65 that may be present on the semiconductor substrate 1 include complementary metal oxide semiconductor (CMOS) devices, fin field effect transistors (finFETs), junction field effect transistors (JFETs), bipolar junction transistor (BJTs) or a combination thereof. FIG. 10D depicts one embodiment of the present disclosure in which a pinch region 41 is present at the interface of the base of a conductive line and a sidewall of a conductive line. FIG. 10E depicts one embodiment of the present disclosure in which the sliver fill 40a is not removed prior to filling the line openings with a conductive material, such as a metal.

FIGS. 1 and 11-15 depict another embodiment of the present disclosure, in which a shared opening region 25 that can result from misalignment between masks for forming the vias 50 and lines 55 is filled with a conformal fill layer 70 before etching the substrate 10, e.g., interlevel dielectric layer 5. Referring to FIG. 1, in one embodiment, the method may begin with forming a first mask layer 15 on a substrate 10, e.g., interlevel dielectric layer 5, that is patterned to correspond to lines. FIG. 1 further depicts one embodiment of forming a second mask layer 20 on the substrate 10, e.g., interlevel dielectric layer 5, over the first mask layer 15. The combination of the first mask layer 15 and the second mask layer 20 provide a pattern that corresponds to the vias and a shared opening region 25 is present between openings in the first mask layer 15 and the second mask layer 20. The first mask layer 15 and the second mask layer 20 that have been described above with reference to the embodiments depicted in FIGS. 1-10B are similar to the first mask layer 15 and the second mask layer 20 that are described with reference to the embodiments of the present disclosure that are consistent with the process flow depicted in FIGS. 1 and 11-15. Therefore, the above description of the first mask layer 15 and the second mask layer 20, as well as the base semiconductor substrate 1, and the interlevel dielectric layer 5, is suitable for these elements in the method described with reference to FIGS. 1 and 11-15.

Figure 11:
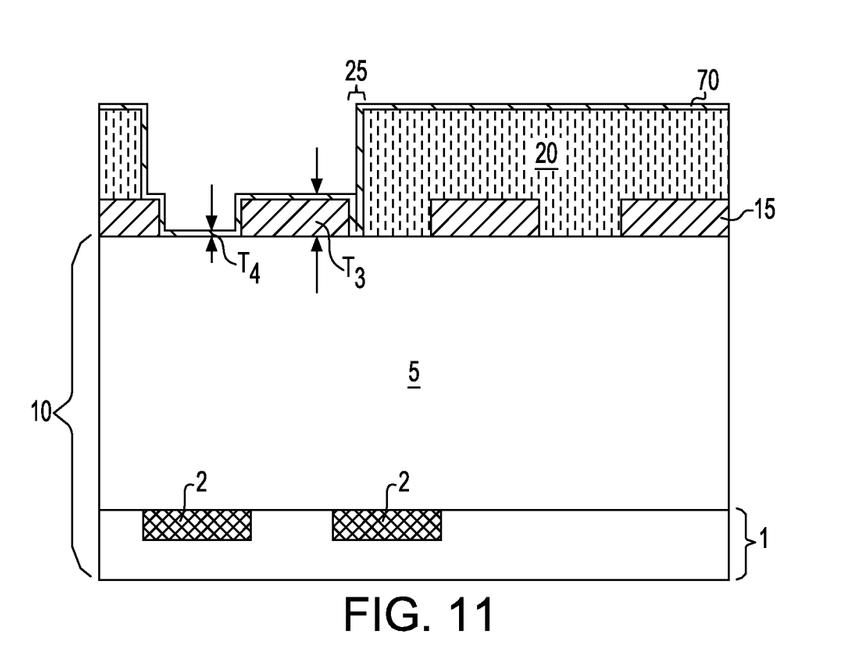
FIG. 11 is a side cross-sectional view depicting one embodiment of depositing a conformal fill layer on the structure depicted in FIG. 1, wherein a first portion of the conformal fill layer that is deposited in the shared opening region has a first thickness, and a remaining portion of the conformal fill layer that is present on the first mask, second mask and the substrate has a second thickness, in accordance with the present disclosure.

FIG. 11 depicts one embodiment of depositing a conformal fill layer 70 on the structure depicted in FIG. 1. The material for the conformal fill layer 70 is a material that is not etched by an etch process that removes the material of the substrate 10, e.g., interlevel dielectric 5. In one embodiment, the conformal fill layer 70 may be a dielectric material, such as an oxide, nitride, or oxynitride. In some embodiments, the conformal fill layer 70 may be at least one of $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides, other carbon-containing materials, organo-inorganic materials such as spin-on glasses and silsesquioxane-based materials, and diamond-like carbon (DLC, also known as amorphous hydrogenated carbon, $\alpha$-C:H). The conformal fill layer 70 may also be composed of a semiconductor material. It is noted that it is not intended that the present disclosure be limited to only the above material compositions for the conformal fill layer 70. For example, the conformal fill layer 70 may be any material that the substrate 10, e.g., interlevel dielectric layer 5, can be selectively etched to. For example, materials that the substrate 10 can be etched to at a ratio of 10:1 or greater can be suitable for the conformal fill layer 70. In another example, materials that the substrate 10 can be etched to at a ratio of 100:1 or greater can be suitable for the conformal fill layer 70.

The conformal fill layer 70 may be deposited using chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The conformal fill layer 70 may also be deposited using evaporation, chemical solution deposition, and physical vapor deposition (PVD) methods.

The thickness of the conformal fill layer 70 is selected so that a conformally deposited layer will fill the shared opening region 25. A first portion of the conformal fill layer 70 that is deposited in the shared opening region 25 has a first thickness T3, and a remaining portion of the conformal fill layer 70 that is present on the first mask layer 15, second mask layer 20 and the substrate 10, e.g., interlevel dielectric layer 5, has a second thickness T4. The first thickness T3 of the conformal fill layer 70 that is present in the shared opening region 25 is greater than the second thickness T4 of the conformal fill layer 70 that is not present in the shared opening region 25. Although, the conformal fill layer 70 is typically deposited using a conformal deposition method, the portion of the conformal fill layer 70 that is present in the shared opening region 25 has a greater thickness than the remaining portions of the conformal fill layer 70 that is not present in the shared opening region 25, because the conformal fill layer 70 is filling the shared opening region 25 side surfaces. The first thickness T3 of the conformal fill layer 70 may range from 5 nm to 90 nm, and the second thickness T4 of the conformal fill layer 70 may range from 4 nm to 20 nm. In another embodiment, the first thickness T3 of the conformal fill layer 70 may range from 10 nm to 30 nm, and the second thickness T4 of the conformal fill layer 70 may range from 6 nm to 9 nm.

Figure 12:
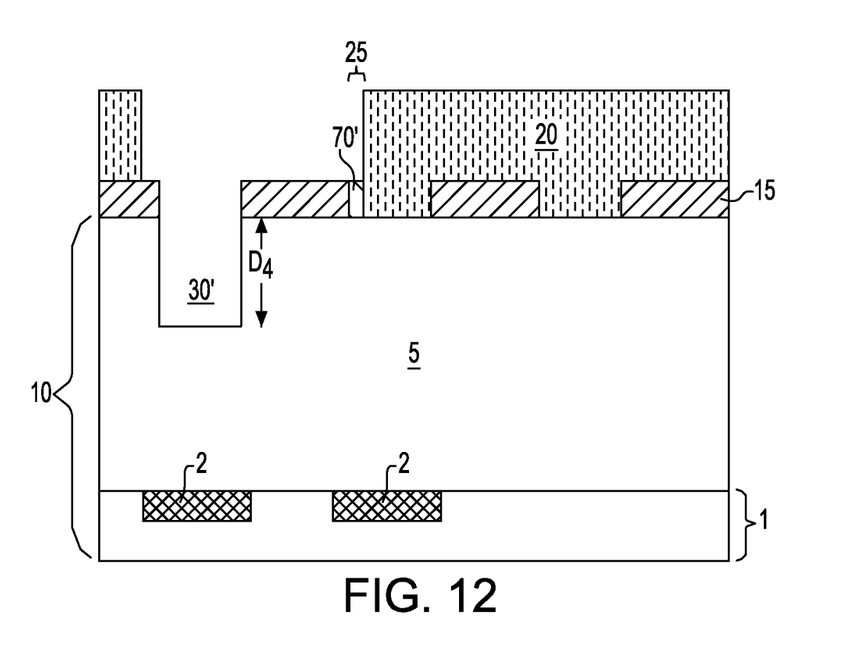
FIG. 12 is a side cross-sectional view depicting isotropically etching the conformal fill layer depicted in FIG. 11 to remove the remaining portion of the conformal fill layer that is not present in the misalignment opening, wherein the first portion of the conformal fill layer remains in the shared opening region, in accordance with one embodiment of the present disclosure.

FIG. 12 depicts one embodiment of isotropically etching the conformal fill layer 70 to remove the remaining portion of the conformal fill layer that is not present in the shared opening region 25, wherein the first portion of the conformal fill layer 70' remains in the shared opening region 25. One example of an isotropic etch that is suitable for removing the first portion of the conformal fill layer is a wet chemical etch. The isotropic etch process for removing the first portion of the conformal fill layer may be a plasma etch, dry chemical etch, or a combination thereof. In one embodiment, in which the conformal fill layer is composed of $SiO_2$, the upper surface of the substrate 10, e.g., interlevel dielectric 5, is SiCOH, and the first mask layer 15 is composed of TiN, the wet etch chemistry for removing the first portion of the conformal fill layer may be composed of dilute HF or buffered HF of sufficient time and concentration to remove 120-140% of the thickness T4 of conformal fill layer 70.

FIG. 12 also depicts first etching the substrate 10, e.g., interlevel dielectric layer 5, using the first mask layer 15, the second mask layer 20, and the remaining portion of the conformal fill layer 70' that is present in the shared opening region 25 as a first etch mask. The first etching of the substrate 10, e.g., interlevel dielectric layer 5, forms a first opening 30' to a first depth D4 into the substrate 10, e.g., interlevel dielectric layer 5. The first etching that forms the first opening 30' may be provided by an anisotropic etch process. The anisotropic etch may include reactive-ion etching (RIE). Other examples of anisotropic etching that can be used at this point of the present disclosure include ion beam etching, or laser ablation. The first etching may be provided by a selective etch. For example, in one embodiment, the etch process employed to form the first opening 30', may remove the material of the substrate 10, e.g., interlevel dielectric layer 5, selectively to the first mask layer 15, the remaining portion of the conformal fill layer 70', and the second mask layer 20. The first etching process may be a timed etch. The first etch may be continued until the base of the first opening 30 that is extended into the interlevel dielectric layer 5 reaches a depth D4 ranging from 25 nm to 400 nm, as measured from the upper surface of the interlevel dielectric layer 5. In another embodiment, the first etch may be continued until the base of the first opening 30' that is extended into the interlevel dielectric layer 5 reaches a depth D4 ranging from 25 nm to 400 nm, as measured from the upper surface of the interlevel dielectric layer 5.

Figure 13:
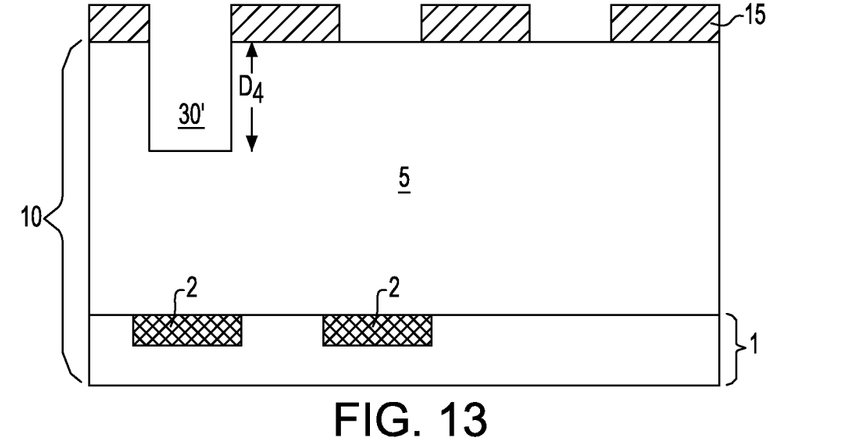
FIG. 13 is a side cross-sectional view depicting first etching the substrate depicted in FIG. 12 using the first mask layer and the second mask layer as a first etch mask, wherein the etching forms a first opening to a first depth into the substrate, in accordance with one embodiment of the present disclosure.

FIG. 13 depicts removing the second mask and the portion of the conformal fill layer that was present in the shared opening region. In one embodiment, the second mask may be removed using oxygen ashing, chemical stripping or selective etching. In one embodiment, the remaining portion of the conformal fill layer may be removed by selective etching. For example, in one embodiment, the second mask and the remaining portion of the conformal fill layer may be removed by an etch that is selective to the substrate 10, e.g., interlevel dielectric layer 5, and the first mask layer 15.

Figure 14:
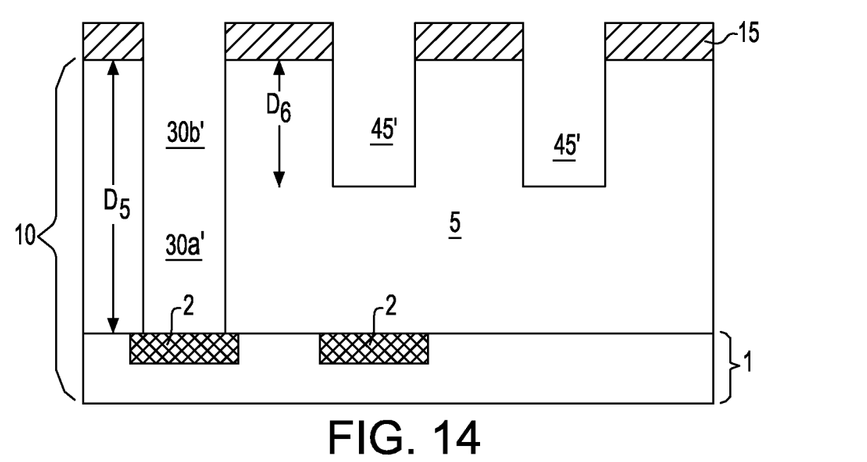
FIG. 14 is a side cross-sectional view depicting second etching the substrate that is depicted in FIG. 13 using the first mask layer as a second etch mask with an etch that is selective to the first mask layer, in accordance with one embodiment of the present disclosure.

FIG. 14 depicts one embodiment of second etching the substrate 10, e.g., interlevel dielectric layer 5, using the only the first mask layer 15 as a second etch mask. In one embodiment, the second etching of the substrate 10 using the first mask layer 15 as a second etch mask extends the first opening to a second depth D5 to provide openings 30a' for the vias. In one embodiment, the second depth D5 ranges from 50 nm to 500 nm. In another embodiment, the second depth D5 ranges from 75 nm to 200 nm. The openings for the vias 30a' are hereafter referred to as via openings 30a'.

In one embodiment, the second etching of the substrate 10 is provided by an anisotropic etch process. Examples of anisotropic etch processes that are suitable for this stage of the present disclosure include reactive ion etch (RIE), ion beam etching, laser ablation or a combination thereof.

The second etching of the substrate 10, e.g., the interlevel dielectric 5, using the first mask layer 15 as the etch mask also forms the openings for the lines 30b', 45'. The openings for the lines 30b', 45' are hereafter referred to as line openings 30b', 45'. In one embodiment, the line openings 30b', 45' are provided by the portion 30b' of the first opening that extends to the first depth D4 and a second opening 45' that is etched into the substrate 10, e.g., interlevel dielectric 5, at a depth D6 that is less than the second depth D5 of the via openings 30a'. In one embodiment, the depth D6 of the line openings 45' may range from 30 nm to 400 nm. In one embodiment, the depth D6 of the line openings 45' may range from 40 nm to 150 nm.

Following second etching of the substrate 10, the at least one of the openings for the vias 30a' and the openings for the lines 30b', 45' may be filled with a conductive material. Filling the openings for the vias 30a' and the openings for the lines 30b', 45' with a conductive material, such as a metal, has been described above with reference to FIGS. 10A and 10B. The description of the vias 50 and lines 55 that are illustrated in FIGS. 10A and 10B are suitable for the vias and lines that are formed using the method described with reference to FIGS. 1 and 11-14.

Referring to FIG. 10A-10E, in one embodiment, an array of conductive pathways is provided that includes a substrate 10 comprised of a dielectric material, e.g., an interlevel dielectric layer 5, and an array of conductive lines 55 at a first depth within the substrate 10. Each of the conductive lines 55 in the array of conductive lines has a length that extends along a horizontal direction of the substrate 10 and is substantially parallel to a plane defined by an upper surface of the substrate. In one embodiment, at least one of the conductive lines 55 has a dimple region 42 on the sidewall of the at least one conductive line 55, and at a lower surface of the at least one of the conductive line 55, as depicted in FIG. 10A. In another embodiment, the at least one of the conductive line 55 has a pinch region 41 on the sidewall of the at least one conductive line 55, and at a lower surface of the at least one of the conductive line 55, as depicted in FIG. 10D. In yet another embodiment, a sliver fill 40a is present along the sidewall of the at least one conductive line 55. In another embodiment, the dimple region 42 and/or the pinch region 41 are not present in the final structure. An array of vias 50 intersect with the array of conductive lines 55. Each of the vias 50 is above or below the first depth within the substrate 10. Each of the vias 50 has a vertical dimension that is perpendicular to the length of each of the conductive lines 55.

Although the conductive features that are etched into the substrate have been described above as including both vias and lines, embodiments have been contemplated in which the first mask layer 15 and the second mask layer 20 are patterned to provide two sets of lines having different directions. For example, the first mask layer 15 and the second mask layer 20 may be employed together to form a first etch feature, e.g., first set of lines having a first direction, wherein one of the first mask layer 15 and the second mask layer 20 may be removed in combination with a second etch process to form a second etch feature, e.g. second set of lines having a second direction. In one example, the first direction of the first set of lines is substantially perpendicular to the second direction of the second set of lines. Misalignment between the first mask layer 15 and the second mask layer 20 that forms a sliver opening in the substrate (as described with reference to FIGS. 1-10), or a shared opening region 24 between the first and second mask layers 15, 20 (as described with reference to FIGS. 1 and 11-14) may be filled with a fill material, i.e., selective etch material. The fill material can ensure that the first set of lines and the second set of lines are not shorted together.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method comprising:
   first etching a substrate according to a first mask, wherein said first mask comprises a first mask layer comprising first mask openings that correspond to line trenches and a second mask layer comprising second mask openings that correspond to at least one via opening, wherein a shared opening region is present between said first mask openings and said second mask openings, and said shared opening region exposes a sliver portion of said substrate, wherein the first etching forms a first etch feature to a first depth, wherein the first etch feature comprises said at least one via opening and the first etching forms a sliver opening in the substrate that corresponds to said shared opening region;
   filling said sliver opening with a fill material;
   forming a second mask by removing a portion of the first mask;
   second etching said substrate exposed by said second mask, wherein the second etching is selective to the fill material, the second etching extends the first etch feature to a second depth that is greater than the first depth, and the second etch forms a second etch feature comprising said line trenches; and
   filling the first etch feature and the second etch feature with a conductive metal, wherein filling said first etch feature and said second etch feature with said conductive metal forms lines and at least one via in said substrate.

2. The method of claim 1, wherein at least one of the line trenches intersects with at least one of the at least one via openings.

3. The method of claim 1, wherein the removing the portion of the first mask comprises removing the second mask layer.

4. The method of claim 1, wherein the sliver opening has a width of less than 25 nm.

5. The method of claim 1, wherein the fill material comprises an oxide, nitride, oxynitride, carbon containing dielectric or a combination thereof.

6. The method of claim 5, wherein the filling of the sliver openings with the fill material comprises depositing a dielectric layer using a conformal deposition process, wherein a first portion of the dielectric layer that is deposited in the at least one via opening has a first thickness, and a second portion of the dielectric layer that is present in the sliver opening has a second thickness that fills the sliver opening.

7. The method of claim 6, wherein the filling of the sliver openings in the substrate with the fill material comprises isotropically etching the dielectric layer to remove the first portion of the dielectric layer, wherein the second portion of the dielectric layer remains in the sliver opening.

8. The method of claim 1, wherein following the second etch of the substrate and before the filling of the line trenches and the via openings with the conductive metal the material for selective etching that fills the sliver opening is removed.

9. The method of claim 6, wherein after the dielectric layer is deposited, the second etch is conducted, wherein the second etch removes the first portion of the dielectric layer.

10. The method of claim 1, wherein the first etch feature further comprises a first trench in the substrate in a first direction, and the second etch feature further comprises a second trench in the substrate in a second direction, and filling the first etch feature and the second etch feature comprises filling the first trench and the second trench with a conductive metal to provide a first wire and a second wire.

11. The method of claim 10, wherein the first direction is substantially perpendicular to the second direction.

\* \* \* \* \*